United States Patent
Ebrahimzad et al.

(10) Patent No.: US 11,838,123 B2
(45) Date of Patent: Dec. 5, 2023

(54) BIT-CHANNEL COMBINER AND COMBINED PROBABILISTIC CONSTELLATION SHAPING AND POLAR ENCODER

(71) Applicant: HUAWEI TECHNOLOGIES CO., LTD., Guangdong (CN)

(72) Inventors: Hamid Ebrahimzad, Kanata (CA); Ali Farsiabi, Ottawa (CA); Zhuhong Zhang, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 29 days.

(21) Appl. No.: 17/576,123

(22) Filed: Jan. 14, 2022

(65) Prior Publication Data

US 2023/0231649 A1 Jul. 20, 2023

(51) Int. Cl.
*H04L 1/00* (2006.01)
*H04L 27/34* (2006.01)

(52) U.S. Cl.
CPC ............ *H04L 1/0041* (2013.01); *H04L 27/34* (2013.01)

(58) Field of Classification Search
CPC ... H04L 1/0042; H04L 1/0045; H04L 1/0047; H04L 1/0057; H04L 1/0058; H04L 1/004; H03M 13/29
See application file for complete search history.

(56) References Cited

U.S. PATENT DOCUMENTS

| 11,057,053 B2 | 7/2021 | Gross et al. | |
| 2018/0367246 A1* | 12/2018 | Kakande | H04L 1/0042 |
| 2020/0044770 A1* | 2/2020 | Lefevre | H04L 1/0042 |

FOREIGN PATENT DOCUMENTS

| CN | 108702161 A | 10/2018 |
| CN | 110495106 A | 11/2019 |
| CN | 111386664 A | 7/2020 |

(Continued)

OTHER PUBLICATIONS

Arikan, "Channel polarization: A method for constructing capacity achieving codes for symmetric binary-input memoryless channels", IEEE Trans. Inf. Theory, vol. 55, pp. 3051-3073, Jul. 2009.

(Continued)

*Primary Examiner* — Shelly A Chase
(74) *Attorney, Agent, or Firm* — BCF LLP

(57) ABSTRACT

A polar encoder comprises an input, an output and a processor operatively connected to the input and to the output. The input either receives first, second and third codewords, or receives information bits used by the processor for generating first, second and third probabilistic constellation shaping codewords. The processor combines the first and second codewords, to produce a first modulation symbol bit, combines the first and third codewords to produce a second modulation symbol bit, and combines the first, second and third codewords to produce a third modulation symbol bit. The output forwards the modulation symbol bits to a bit to symbol mapper. The polar encoder may be included in a transmitter that further comprises the bit to symbol mapper receiving the modulation symbol bits and generating modulation symbols, and a modulator modulating a carrier using the modulation symbols.

14 Claims, 7 Drawing Sheets

(56) References Cited

FOREIGN PATENT DOCUMENTS

| | | |
|---|---|---|
| CN | 113411135 A | 9/2021 |
| WO | 2019095267 A1 | 5/2019 |

OTHER PUBLICATIONS

Tal et al., "List decoding of polar codes", IEEE Trans. IT, vol. 61, No. 5, pp. 2213-2226, Mar. 2015.

El-Khamy et al., "Relaxed polar codes", IEEE Trans. IT, vol. 63, No. 4, pp. 1986-2000, Apr. 2017.

Koike-Akino et al., "Irregular Polar Coding for Complexity-Constrained Lightwave Systems", Journal of lightwave tech, vol. 36, No. 11, 2018.

Sarkis et al., "Fast polar decoders: Algorithm and implementation", IEEE J. Sel. Areas Commun., vol. 32, No. 5, pp. 946-957, May 2014.

Hanif et al., "Fast successive-cancellation decoding of polar codes: Identification and decoding of new nodes", IEEE Commun. Lett., vol. 21, No. 11, pp. 2360-2363, Nov. 2017.

Hashemi et al., "Simplified successive cancellation list decoding of polar codes", IEEE Int. Symp. on Inform. Theory, Jul. 2016, pp. 815-819.

Mahdavifar et al., "Polar Coding for Bit-Interleaved Coded Modulation", IEEE Transactions on Vehicular Technology, Jan. 2015.

Zehavi, "8-PSK trellis codes for a Rayleigh channel", IEEE Trans. Commun., vol. 40, No. 5, pp. 873-884, May 1992.

Caire et al., "Bit-interleaved coded modulation", IEEE Trans. Inf. Theory, vol. 44, No. 3, pp. 927-946, May 1998.

Barakatain et al., "Performance-Complexity Tradeoffs of Concatenated FEC for Higher-Order Modulation", Journal of Lightwave Technology, vol. 38, No. 11, pp. 2944-2953, Jun. 2020.

International Search Report and Written Opinion issued by the ISA/CN dated Mar. 15, 2023 in connection with the corresponding application No. PCT/CN2022/142220.

\* cited by examiner

BIT-CHANNEL COMBINER AND COMBINED PROBABILISTIC CONSTELLATION SHAPING AND POLAR ENCODER

CROSS-REFERENCE TO RELATED APPLICATIONS

This is the first application filed for the instantly disclosed technology.

TECHNICAL FIELD

The present disclosure generally relates to the field of communication networks and, in particular, to a bit-channel combiner and to a combined probabilistic constellation shaping and polar encoder.

BACKGROUND

Forward error correction code (FEC) provides reliable communication in many digital communication networks. In high throughput optical transmission systems, FEC may consume more than half of the power in an optical Digital Signal Processing (oDSP) part. For this reason, the industry is searching for solutions involving FEC with high coding gain and low power consumption.

Existing solutions for designing FEC comprise many different FEC types, for example Algebraic Code, convolutional turbo code, low-density parity-check code (LDPC), turbo product code (TPC), and the like. Recently, a new type of code called "polar code" has been proposed as a FEC technique. Polar code is the first and only family of error-correction codes for which it is possible to demonstrate analytically that it approaches the Shannon capacity.

In more details, polar code uses a transformation that polarizes the capacity of bit channels. More precisely, after applying this transformation to bit channels, the capacity of some of them will approach unity while the capacity of the rest will approach to zero. The number of bit channels with capacity of about one divided to the total bit channel numbers approaches the channel capacity when the number of bit channels goes to infinity. Data may be sent through the bit channels with this capacity of one and not through the other bit channels. These "good" bit channels are used to carry message bits while other bits channels carry frozen bits.

FIG. 1 (Prior Art) provides a high-level, schematic representation of polar code encoding. N user bits $u_1, u_2, \ldots u_N$, which include a number of information bits and a number of frozen bits, are applied to a polar encoder G that outputs a noisy polar codeword of N bits $y_1, y_2, \ldots y_N$.

Another example of a polar code encoding method is described in U.S. Pat. No. 11,057,053 to Gross et al., issued on Jul. 6, 2021, the disclosure of which is incorporated by reference herein in its entirety.

A recent successive cancellation method for decoding the polar code suggests using successive cancelation list (SCL) equipped with cyclic redundancy check (CRC). Such a SCL-CRC-aided decoder provides better performance compared to conventional successive cancellation (SC) decoders. However, both SC decoders and SCL-CRC-aided decoders suffer from high latency, preventing their use in high throughput applications.

Another recent technique used in many digital communication networks is coded modulation. In coded modulation, high order modulation uses a plurality of bits per symbol for high spectral efficiency. Bit interleaved coded modulation (BICM) is an efficient type of coded modulation. BICM is conventionally used with the same FEC scheme to protect all bits of a modulation constellation. An important drawback of BICM is its power consumption. Protecting all bits of the modulation constellation with the same FEC scheme implies large power consumption.

Consequently, there is still a need for FEC techniques that overcome the deficiencies of the prior art.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

A first object of the present disclosure is to provide a bit-channel combiner, comprising:
an input configured to receive a first codeword, a second codeword and a third codeword;
an output configured to forward modulation symbol bits to a bit to symbol mapper; and
a processor operatively connected to the input and to the output, the processor being configured to:
combine the first and second codewords to produce a first modulation symbol bit,
combine the first and third codewords to produce a second modulation symbol bit, and
combine the first, second and third codewords to produce a third modulation symbol bit.

In some implementations of the present technology, the processor is further configured to implement a 3×3 Kernel matrix for combining the first, second and third codewords.

In some implementations of the present technology, the 3×3 Kernel matrix is $$G3 = \begin{bmatrix} 1 & 1 & 1 \\ 1 & 0 & 1 \\ 0 & 1 & 1 \end{bmatrix}.$$

In some implementations of the present technology, the processor is further configured to apply an exclusive-OR (XOR) function to combine the first and second codewords; apply an XOR function to combine the first and third codewords; and apply an XOR function to combine the first, second and third codewords.

A second object of the present disclosure is to provide a transmitter, comprising:
the bit-channel combiner as defined in the preceding paragraphs;
a bit to symbol mapper configured to receive the first, second and third modulation symbol bits from the bit-channel combiner and to generate modulation symbols; and
a modulator configured to receive the modulation symbols from the bit to symbol mapper and to modulate a carrier using the modulation symbols.

In some implementations of the present technology, wherein the bit to symbol mapper is further configured to combine two sets of modulation symbol bits received from the bit-channel combiner to form a 64 quadrature amplitude modulation symbol.

A third object of the present disclosure is to provide a combined probabilistic constellation shaping (PCS) and polar encoder, comprising:
  an input configured to receive a group of information bits;
  an output configured to forward modulation symbol bits to a bit to symbol mapper; and
  a processor operatively connected to the input and to the output, the processor being configured to:
    generate a set of PCS-encoded codewords based on the group of information bits,
    combine first and second PCS-encoded codewords of the set to produce a first modulation symbol bit,
    combine the first PCS-encoded codeword and a third PCS-encoded codeword of the set to produce a second modulation symbol bit, and
    combine the first, second and third PCS-encoded codewords of the set to produce a third modulation symbol bit.

In some implementations of the present technology, the processor is further configured to implement a 3×3 Kernel matrix for combining the first, second and third PCS-encoded codewords.

In some implementations of the present technology, the 3×3 Kernel matrix is $$G3 = \begin{bmatrix} 1 & 1 & 1 \\ 1 & 0 & 1 \\ 0 & 1 & 1 \end{bmatrix}.$$

In some implementations of the present technology, the processor is further configured to apply an exclusive-OR (XOR) function to combine the first and second PCS-encoded codewords; apply an XOR function to combine the first and third PCS-encoded codewords; and apply an XOR function to combine the first, second and third PCS-encoded codewords.

In some implementations of the present technology, the processor is further configured to split the group of information bits into a first set of Ks information bits and second set of Kns information bits; split further the first set of Ks information bits into first and second subgroups of Ns/2 bits, the first and second subgroups of Ns/2 bits containing redundancy bits added to the first set of Ks information bits; apply a hard forward error correction to the first and second subgroups of Ns/2 bits and to the second set of Kns information bits to generate a set of Kp parity bits; and generate the set of PCS-encoded codewords based on the first and second subgroup of Ns/2 bits, on the second set of Kns information bits, and further based on the set of Kp parity bits.

In some implementations of the present technology, the bits of the first set of Ks information bits have an even probability; and the processor is further configured to generate the first and second subgroups of Ns/2 bits so that the bits in the first and second subgroups of Ns/2 bits have uneven probabilities.

In some implementations of the present technology, the processor is further configured to generate the first PCS-encoded codeword by applying the second set of Kns information bits and the set of Kp parity bits to a first polar sub-encoder; generate the second PCS-encoded codeword by applying an XOR combination of the first and second subgroups of Ns/2 bits to a second polar sub-encoder; and generate the third PCS-encoded codeword applying an XOR combination of the first subgroup of Ns/2 bits and of Ns/2 bits of the first PCS-encoded codeword to a third polar sub-encoder.

In some implementations of the present technology, generating the first PCS-encoded codeword produces Kp1 parity bits; generating the second PCS-encoded codeword produces Kp2 parity bits; generating the third PCS-encoded codeword produces Kp3 parity bits; the first, second and third PCS-encoded codewords each comprise N/3 bits; N/3 is equal to Kns plus Kp plus Kp1; N/3 is equal to Ns/2 plus Kp2; and N/3 is equal to Ns/2 plus Kp3.

A fourth object of the present disclosure is to provide a transmitter, comprising:
  the combined PCS and polar encoder as defined in the preceding paragraphs; and
  a bit to symbol mapper configured to receive the first, second and third modulation symbol bits from the combined PCS and polar encoder and to generate modulation symbols; and
  a modulator configured to receive the modulation symbols from the bit to symbol mapper and to modulate a carrier using the modulation symbols.

In some implementations of the present technology, the bit to symbol mapper is further configured to combine two sets of modulation symbol bits received from the combined PCS and polar encoder to form a 64 quadrature amplitude modulation symbol.

BRIEF DESCRIPTION OF THE FIGURES

The features and advantages of the present disclosure will become apparent from the following detailed description, taken in combination with the appended drawings, in which.

Figure 1:
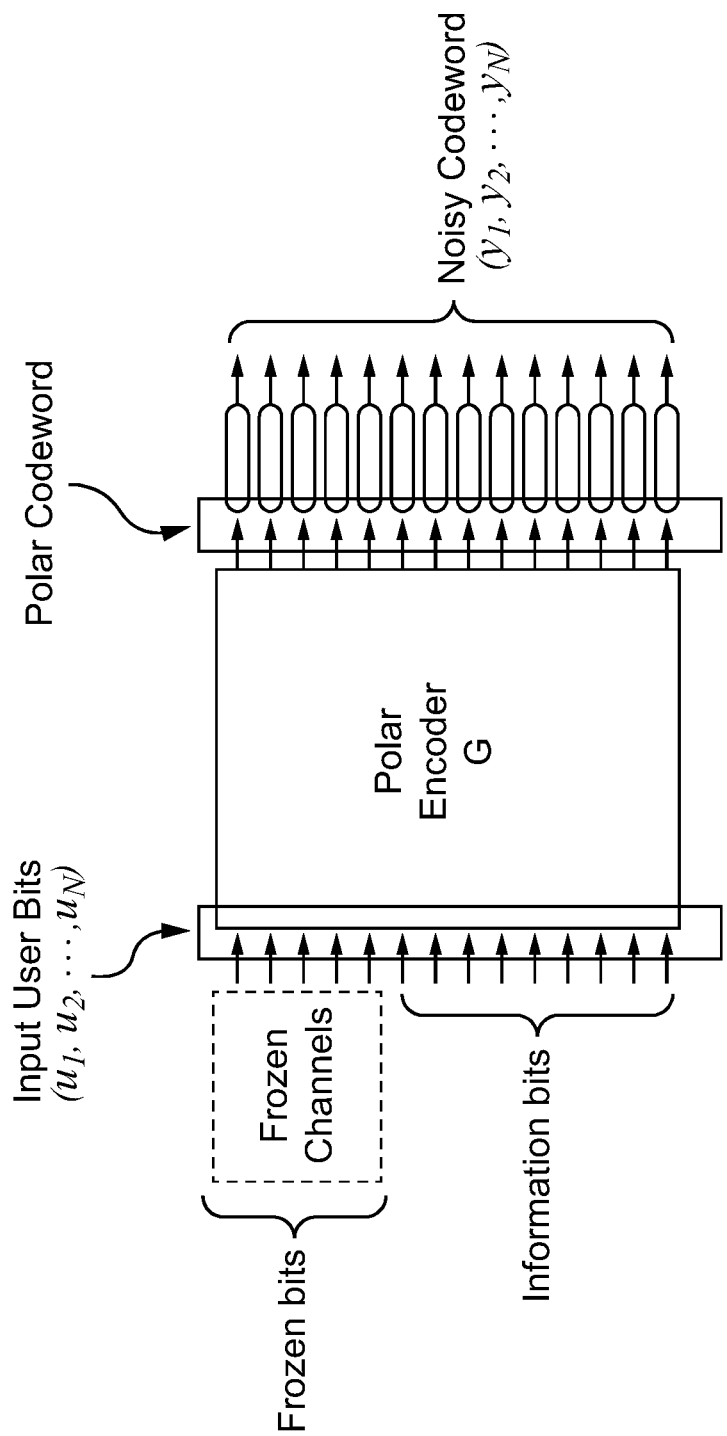
FIG. 1 (Prior Art) provides a high-level, schematic representation of polar code encoding.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain to.

In some aspects of the present technology, multilevel coded modulation employs a strong forward error correction (FEC) scheme for some constellation bits and a simpler FEC scheme for the rest of the bits. Efficient polar coding is employed with bit interleaved coded modulation (BICM) for high throughput with limited latency and limited power consumption.

In some embodiments of the present technology, BICM with polar coding is proposed for 64-level quadrature amplitude modulation (64 QAM). In this context, each 64 QAM modulation symbol is a cartesian product of two independent eight-level pulse amplitude modulation (8 PAM) symbols. Three bits define each 8 PAM symbol, so a codeword length of three (3) is used. Log likelihood ratios (LLR) of various bits of a same constellation are combined in first level of polarization, using a 3×3 Kernel (also called "Kernel 3"), this Kernel size being chosen according to the codeword length for the 8 PAM symbols. Polar code with Kernel 3 does not have systematic representation, so a semi-systematic representation scheme is introduced.

In more details, all bit channels corresponding to one modulation symbol are combined so that all bit channels are subject to a same level of channel noise and so that there is a strong correlation between the noise of different bit channels. In fact, bit channels have different reliabilities. In other words, when the LLR of individual bits of a symbol are calculated, on average, these individual bits have different reliabilities. However, these individual bits are still subjected to the same level of channel noise because all of the bit channels belong to the bits of a constellation symbol. For example, in 8 PAM, the symbols may be represented by a non-binary alphabet comprising [−7, −5, −3, −1, +1, +3, +5, +7]. Each of these non-binary symbols is corrupted by noise. Each symbol is represented by 3 bits, each of these 3 bits seeing different level of noise in binary domain. Three bit channels are present for 64 QAM modulation, so a polarization Kernel with size 3*3 is employed.

In some embodiments of the present technology, the proposed semi-systematic code is applied in the context of probabilistic constellation shaping (PCS).

Figure 2:
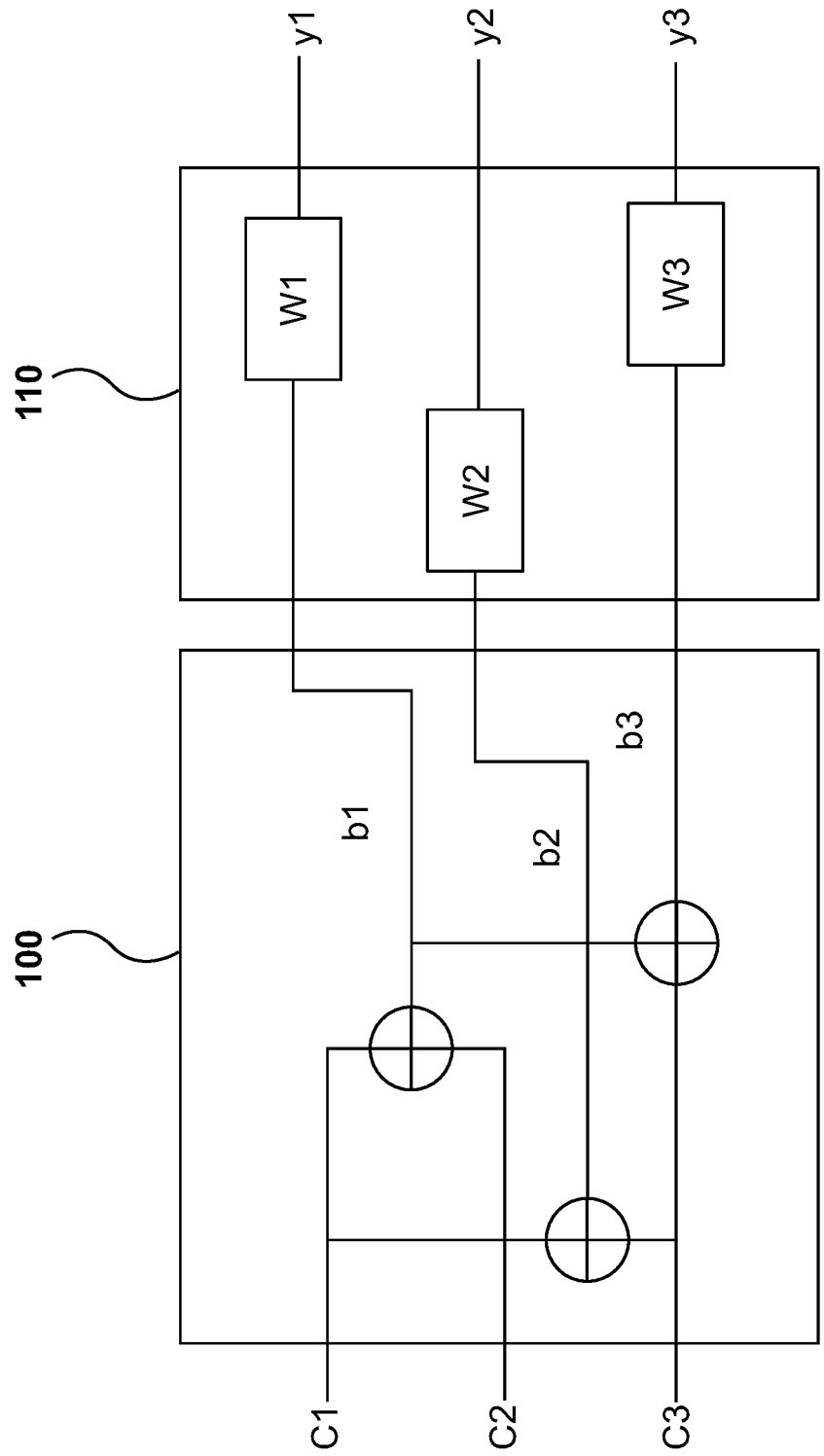
FIG. 2 is a simplified block diagram of a bit-channel combiner using a 3×3 Kernel in accordance with an embodiment of the present technology.

Referring now to the drawings, FIG. 2 is a simplified block diagram of a bit-channel combiner 100 using a 3×3 Kernel. The 3×3 Kernel may be defined as a matrix G3, as follows:

$$G3 = \begin{bmatrix} 1 & 1 & 1 \\ 1 & 0 & 1 \\ 0 & 1 & 1 \end{bmatrix}$$

Figure 3:
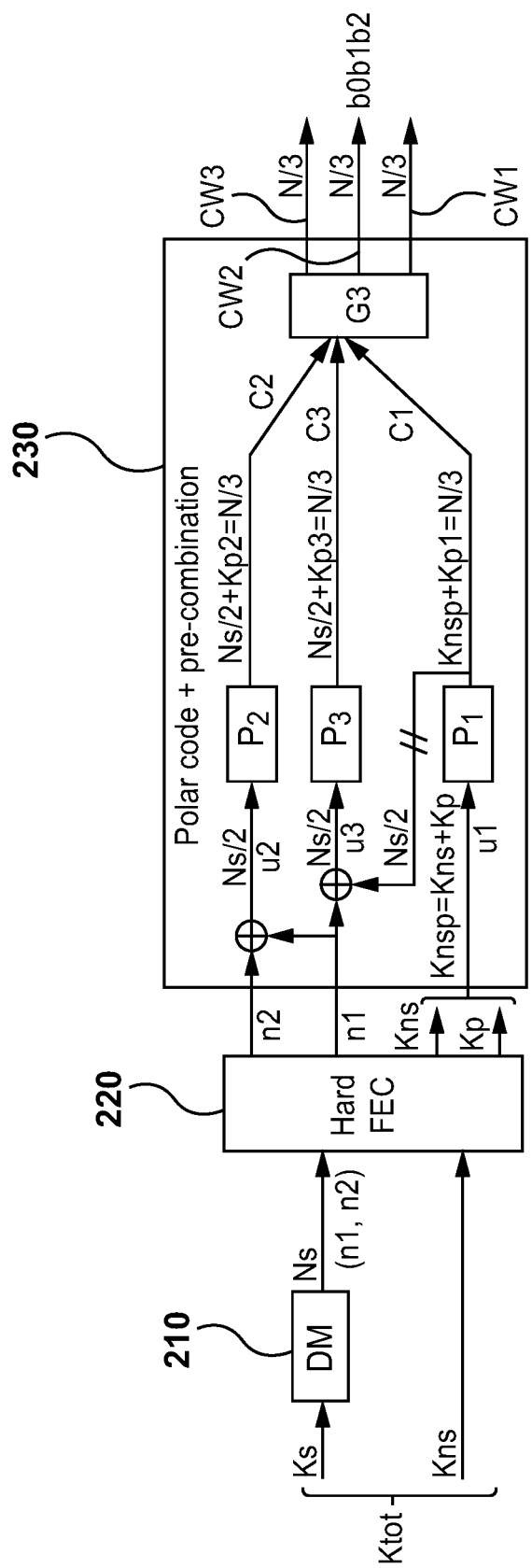
FIG. 3 is a simplified block diagram of a combined encoder integrating probabilistic constellation shaping (PCS) and polar coding in accordance with an embodiment of the present technology.

Codewords C1, C2 and C3 received at an input of the bit-channel combiner 100. A processor implements the 3×3 Kernel G3 that combines C1 and C2 in an XOR operation to form a bit b1. C1 and C3 are combined in an XOR operation by the 3×3 Kernel G3 to form a bit b2. Bit b1 is then combined with C3 in an XOR operation by the 3×3 Kernel G3 to form a bit b3—equivalently, bit b3 may be obtained by XOR operations of C1, C2 and C3. A bit to symbol mapper (shown in later Figures) maps the bits b1, b2 and b3 on a modulation constellation, for example on 8 PAM symbols. The three bits b1, b2 and b3 will be impacted by their transmission on a channel 110, with bit-channels W1, W2 and W3 respectively impacting the bits b1, b2 and b3. The bit-channels W1, W2 and W3 are expected to be different because of the different positions of the bits b1, b2 and b3 on the modulation symbols. A receiver (shown on a later Figure), after the channel 110, will calculate log likelihood ratios (LLR) values L1, L2 and L3 for values y1, y2 and y3 that correspond to the bits b1, b2 and b3, with added noise and non-linearities caused by the bit-channels W1, W2 and W3. Estimated codewords denoted C1_est, C2_est and C3_est, may be calculated from L1, L2 and L3 as follows:

$C1\_est = F(L1,L2,L3);$ $C2\_est = G(L1,F(L2,L3),C1\_est);$ and $C3\_est = (1-2*C1\_est)*L1 + (1-2V3)*L3;$ Where:

$F(x1,x2, \ldots ,xt) = \text{sign}(x1)\text{sign}(x2)* \ldots *\text{sign}(xt)\min(|x1|,|x2|, \ldots ,|xt|);$ $G(a,b,c) = (1-2c)*a + b;$ and $V3 = C1\_est \text{ XOR } C2\_est.$ FIG. 3 is a simplified block diagram of a combined encoder 200 integrating probabilistic constellation shaping (PCS) and polar coding. A number Ktot of information bits, for example client bits, is separated into groups having Ks and Kns bits. In at least some embodiments, the Ktot information bits are separated into the groups having Ks and Kns bits according to design parameters that may vary according to the requirements of various applications that generate these information bits.

A distribution matcher (DM) 210 receives the group of Ks bits and generates bit subgroups n1 and n2, each of which includes Ns/2 bits. In an embodiment, the DM 210 may add some redundancy bits, so that the number of bits Ns contained in the sum of the subgroups n1 and n2 may be greater than Ks. While the bits of the group having Ks bits may have an equal probability of being 0 or 1, the DM 210 may modify this probability for the bits in the subgroups n1 and n2. The addition of redundancy bits by the DM 210 may cause the bits in the subgroups n1 and n2 to have different probability of occurrence, with a resulting impact on the shape of the constellation symbols at the transmitter.

The group having Kns bits and the bits of the subgroups n1 and n2 are applied to a hard FEC encoder 220, for example and without limitation a systematic FEC encoder, which generates Kp parity bits. The hard FEC encoder 230 may have a rate Rh, defined as follows:

$Rh = (Kns+Ns)/(Kns+Ns+Kp)$

The bits in the subgroups n1 and n2, the group of Kns bits and the Kp parity bits are applied to a polar coding and combining block 230. The polar coding and combining block 230 comprises three sub-encoders P1, P2 and P3, which may for example and without limitation be systematic polar coder.

In the polar coding and combining block 230, the group having Kns bits and the Kp parity bits are combined (e.g. concatenated) into a group u1 containing Knsp bits. The group u1 is applied to a first polar sub-encoder P1. The first polar sub-encoder P1 outputs a PCS-encoded codeword C1 having a length N/3. The first polar sub-encoder P1 generates Kp1 additional parity bits so that C1 contains Knsp plus Kp1 bits in total (N/3 being equal to Knsp plus Kp1).

The bits of the subgroups n1 and n2 are combined using an XOR function to provide a group u2, containing Ns/2 bits, applied to a second polar sub-encoder P2. The second polar sub-encoder P2 outputs a PCS-encoded codeword C2 having a length N/3. The second polar sub-encoder P2 generates Kp2 additional parity bits so that C2 contains Ns/2 plus Kp2 bits in total (N/3 being equal to Ns/2 plus Kp2).

The bits from the subgroup n1 and Ns/2 of the bits of the PCS-encoded codeword C1 (for example the first Ns/2 bits of C1) from the first polar sub-encoder P1 are combined using another XOR function to also provide a group u3, containing Ns/2 bits, applied to a third polar sub-encoder P3. The third polar sub-encoder P3 outputs a PCS-encoded codeword C3 having a length N/3. The third polar sub-encoder P3 generates Kp3 additional parity bits so that C3 contains Ns/2 plus Kp3 bits in total (N/3 being equal to Ns/2 plus Kp3).

The PCS-encoded codewords C1, C2 and C3 are applied to the 3×3 Kernel matrix G3 introduced in the description of FIG. 2. The 3×3 Kernel matrix G3 outputs more codewords Cw1, Cw2 and Cw3 as follows:

$$Cw1 = C1 \text{ XOR } C2;$$

$$Cw2 = C1 \text{ XOR } C3; \text{ and}$$

$$Cw3 = C1 \text{ XOR } C2 \text{ XOR } C3.$$

It may be observed that the codeword Cw1 has a uniform distribution. A distribution of the codeword Cw2 is similar to that of the sub-group n1 and a distribution of the codeword Cw3 has a distribution similar to that of the sub-group n2. For mapping on an 8 PAM constellation, Cw1 may be used to form a sign bit b0 while Cw2 and Cw3 may be used as amplitude bits b1 and b2. A 64 QAM constellation symbol may be formed of a cartesian product of two combinations such as b0, b1, b2.

In an embodiment, to preserve the joint distribution of two bits, the sub-encoders P2 and P3 may be forced to have same message set. In this context, the sub-encoders P2 and P3 may have less than 2% overhead, providing a desired distribution for most transmitted symbols.

Figure 4:
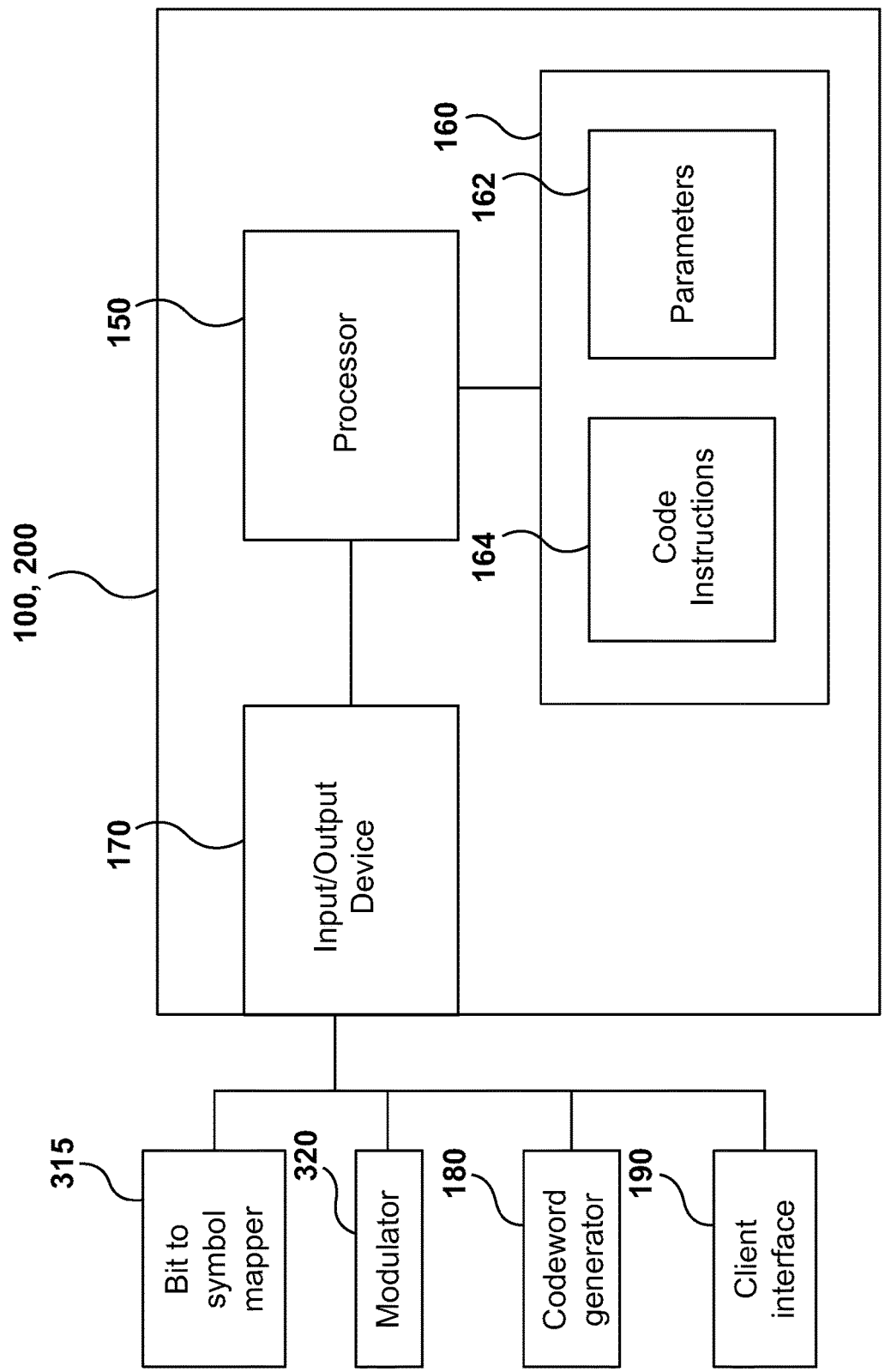
FIG. 4 is a diagram block diagram of an implementation of the bit-channel combiner of FIG. 2 and of the combined encoder of FIG. 3 in accordance with an embodiment of the present technology.

FIG. 4 is a diagram block diagram of an implementation of the bit-channel combiner 100 of FIG. 2 and of the combined encoder 200 of FIG. 3. Some components shown on FIG. 4 may not be present in all embodiments. The bit-channel combiner 100 or combined encoder 200 comprises a processor or a plurality of cooperating processors (represented as a processor 150 for simplicity), a memory device or a plurality of memory devices (represented as a memory device 160 for simplicity), an input/output device or a plurality of input/output devices (represented as an input/output device 170 for simplicity). Separate input devices and output devices (not shown) may be present instead of the input/output device 170. The processor 150 is operatively connected to the memory device 160 and to the input/output device 170. The memory device 160 includes a storage 162 for storing parameters used in the operations of the bit-channel combiner 100 and/or of the combined encoder 200. The memory device 160 may also comprise a non-transitory computer-readable medium 164 for storing instructions that are executable by the processor 150 for operations of the bit-channel combiner 100 and/or of the combined encoder 200.

The bit-channel combiner 100 may receive codewords such as C1, C2 and C3, via the input/output device 170, from a codeword generator 180. The combined encoder 200 may receive the groups having Ks and Kns information bits from a client interface 190.

Through the input/output device 170, the bit-channel combiner 100 or combined encoder 200 may be operatively connected to a bit to symbol mapper 315. The processor 150 may cause the input/output device 170 to forward the modulation symbol bits to the bit to symbol mapper 315 that in turn forms the modulation symbols. In at least one embodiment, the bit to symbol mapper 315 may be integrated in the bit-channel combiner 100 or combined encoder 200 and the modulated symbols may be transmitted, via the input/output device 170, to a modulator 320.

Figure 5:
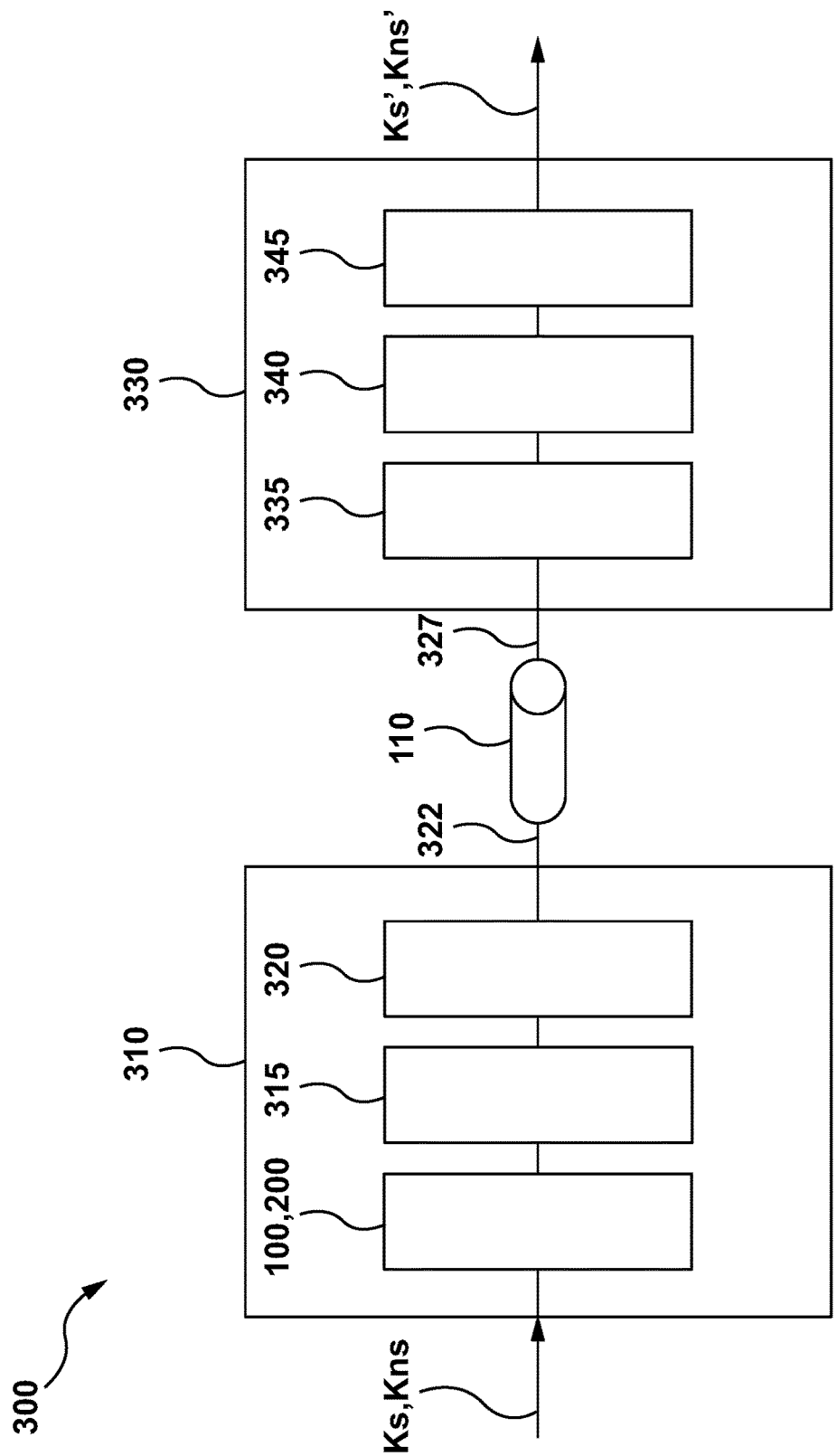
FIG. 5 is a block diagram of a system implementing the bit-channel combiner of FIG. 2 and/or the combined encoder of FIG. 3 in accordance with an embodiment of the present technology.

FIG. 5 is a block diagram of a system 300 implementing the bit-channel combiner 100 of FIG. 2 and/or the combined encoder 200 of FIG. 3. The system 300 includes a transmitter 310 and a receiver 330, which are interconnected via the communication channel 110. The groups of Ks and Kns information bits are applied to the transmitter 310. In the transmitter 310, the bit-channel combiner 100 or the combined encoder 200 generates the modulation symbol bits b1, b2, b3, in the manner described hereinabove. The bit to symbol mapper 315 forms modulation symbols based on the modulation symbol bits b1, b2, b3. Two sets of such groups of three bits are used by the bit to symbol mapper 315 to generate each 64 QAM modulation symbol. The modulator 320 uses these modulation symbols to modulate a carrier for forwarding a modulated version 322 of these bits b1, b2, b3 on the channel 110.

Because of noise and non-linearities in the channel 110, the modulated carrier carrying a noisy version 327 of the modulated bits b1, b2, b3 is received at the receiver 330. In the receiver 330, a demodulator 335 receives and demodulates the modulated carrier. A symbol to bit mapper 340 recovers noisy bits y1, y2 and y3. A decoder 345 calculates LLRs L1, L2, L3 of the received noisy bits y1, y2 and y3, in the manner described hereinabove, to generate Ks' and Kns' recovered information bits, which represent the Ks and Kns information bits with a very small bit error rate.

Figure 6:
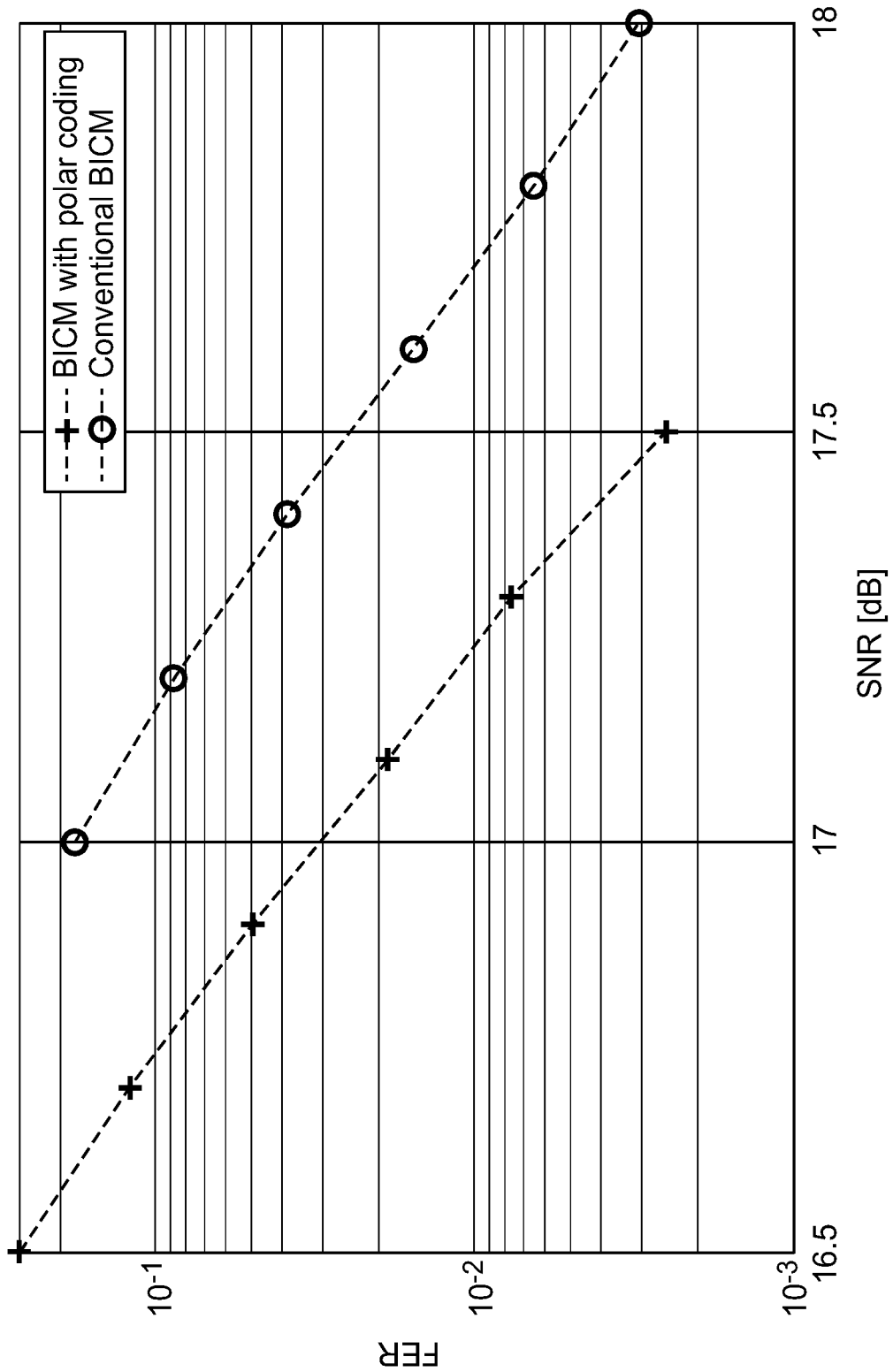
FIG. 6 is a graph providing a comparison between correlated and ideally interleaved BICM in accordance with an embodiment of the present technology.
Figure 7:
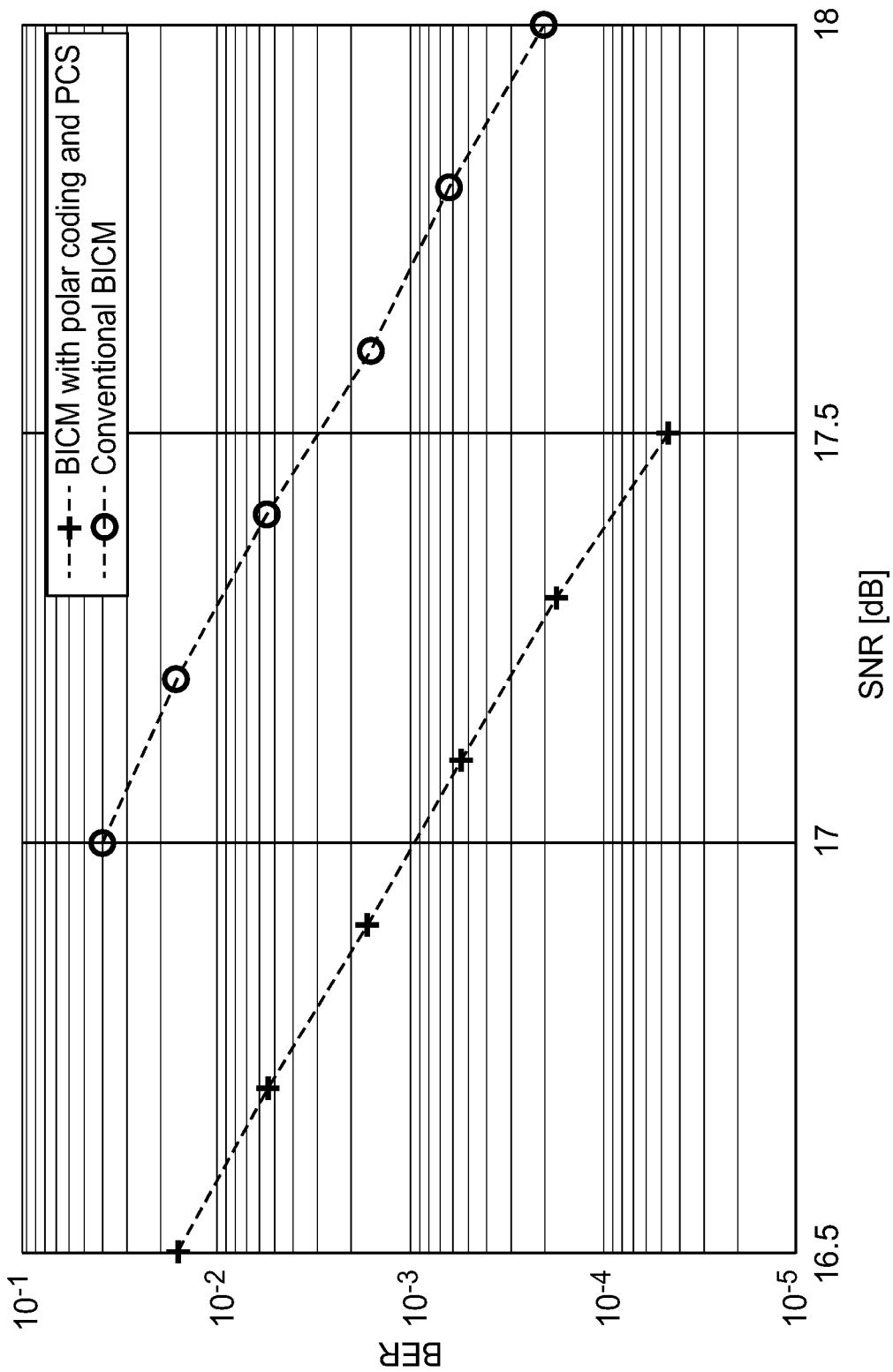
FIG. 7 is a graph providing a comparison between a semi-systematic correlated and a non-systematic ideally interleaved BICM in accordance with an embodiment of the present technology.

FIG. 6 is a graph providing a comparison between correlated and ideally interleaved BICM. On FIG. 6, the comparison is provided in terms of a frame error rate (FER) as a function of a signal to noise ratio (SNR), expressed in dB. FIG. 7 is a graph providing a comparison between a semi-systematic correlated and a non-systematic ideally interleaved BICM. On FIG. 7, the comparison is provided in terms of a bit error rate (BER) as a function of a SNR. FIG. 6 demonstrates that an improvement of over 0.50 dB may be achieved while FIG. 7 shows that an improvement of over 0.65 dB is attainable.

It will be appreciated that the bit-channel combiner 100 of FIG. 2 and/or the combined encoder 200 of FIG. 3 may also be implemented in whole or in part as computer programs, which may exist in a variety of forms both active and inactive. Such as, the computer programs may exist as software program(s) comprised of program instructions in source code, object code, executable code or other formats. Any of the above may be embodied on a computer readable medium, which include storage devices and signals, in compressed or uncompressed form. Representative computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

It is to be understood that the operations and functionality of the described bit-channel combiner 100 of FIG. 2 and/or combined encoder 200 of FIG. 3, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A bit-channel combiner, comprising:
an input configured to receive a first codeword, a second codeword and a third codeword;
an output configured to forward modulation symbol bits to a bit to symbol mapper; and
a processor operatively connected to the input and to the output, the processor being configured to:
combine the first and second codewords to produce a first modulation symbol bit,
combine the first and third codewords to produce a second modulation symbol bit, and
combine the first, second and third codewords to produce a third modulation symbol bit;
wherein the processor is further configured to implement a 3×3 Kernel matrix for combining the first, second and third codewords.

2. The bit-channel combiner of claim 1, wherein the 3×3 Kernel matrix is:

$$G3 = \begin{bmatrix} 1 & 1 & 1 \\ 1 & 0 & 1 \\ 0 & 1 & 1 \end{bmatrix}.$$

3. The bit-channel combiner of claim 1, wherein the processor is further configured to:
apply an exclusive-OR (XOR) function to combine the first and second codewords;
apply an XOR function to combine the first and third codewords; and
apply an XOR function to combine the first, second and third codewords.

4. A transmitter, comprising:
the bit-channel combiner as defined in claim 1;
the bit to symbol mapper as defined in claim 1, the bit to symbol mapper being configured to receive the first, second and third modulation symbol bits from the bit-channel combiner and to generate modulation symbols; and
a modulator configured to receive the modulation symbols from the bit to symbol mapper and to modulate a carrier using the modulation symbols.

5. The transmitter of claim 4, wherein the bit to symbol mapper is further configured to combine two sets of modulation symbol bits received from the bit-channel combiner to form a 64 quadrature amplitude modulation symbol.

6. A combined probabilistic constellation shaping (PCS) and polar encoder, comprising:
an input configured to receive a group of information bits;
an output configured to forward modulation symbol bits to a bit to symbol mapper; and
a processor operatively connected to the input and to the output, the processor being configured to:
generate a set of PCS-encoded codewords based on the group of information bits,
combine a first PCS-encoded codeword and a second PCS-encoded codeword of the set to produce a first modulation symbol bit,
combine the first PCS-encoded codeword and a third PCS-encoded codeword of the set to produce a second modulation symbol bit, and
combine the first, second and third PCS-encoded codewords of the set to produce a third modulation symbol bit;
wherein the processor is further configured to implement a 3×3 Kernel matrix for combining the first, second and third PCS-encoded codeword.

7. The combined PCS and polar encoder of claim 6, wherein the 3×3 Kernel matrix is:

$$G3 = \begin{bmatrix} 1 & 1 & 1 \\ 1 & 0 & 1 \\ 0 & 1 & 1 \end{bmatrix}.$$

8. The combined PCS and polar encoder of claim 6, wherein the processor is further configured to:
apply an exclusive-OR (XOR) function to combine the first and second PCS-encoded codewords;
apply an XOR function to combine the first and third PCS-encoded codewords; and
apply an XOR function to combine the first, second and third PCS-encoded codewords.

9. The combined PCS and polar encoder of claim 6, wherein the processor is further configured to:
split the group of information bits into a first set of Ks information bits and second set of Kns information bits;
generate first and second subgroups of Ns/2 bits based on the first set of Ks information bits, the first and second subgroups of Ns/2 bits containing redundancy bits so that Ns is greater than Ks;
apply a hard forward error correction to the first and second subgroups of Ns/2 bits and to the second set of Kns information bits to generate a set of Kp parity bits; and
generate the set of PCS-encoded codewords based on the first and second subgroup of Ns/2 bits, on the second set of Kns information bits, and further based on the set of Kp parity bits.

10. The combined PCS and polar encoder of claim 9, wherein:
the bits of the first set of Ks information bits have an even probability; and
the processor is further configured to generate the first and second subgroups of Ns/2 bits so that the bits in the first and second subgroups of Ns/2 bits have uneven probabilities.

11. The combined PCS and polar encoder of claim 9, wherein the processor is further configured to:
  generate the first PCS-encoded codeword by applying the second set of Kns information bits and the set of Kp parity bits to a first polar sub-encoder;
  generate the second PCS-encoded codeword by applying an XOR combination of the first and second subgroups of Ns/2 bits to a second polar sub-encoder; and
  generate the third PCS-encoded codeword applying an XOR combination of the first subgroup of Ns/2 bits and of Ns/2 bits of the first PCS-encoded codeword to a third polar sub-encoder.

12. The combined PCS and polar encoder of claim 9, wherein:
  generating the first PCS-encoded codeword produces Kp1 parity bits;
  generating the second PCS-encoded codeword produces Kp2 parity bits;
  generating the third PCS-encoded codeword produces Kp3 parity bits;
  the first, second and third PCS-encoded codewords each comprise N/3 bits;
  N/3 is equal to Kns plus Kp plus Kp1;
  N/3 is equal to Ns/2 plus Kp2; and
  N/3 is equal to Ns/2 plus Kp3.

13. A transmitter, comprising:
  the combined PCS and polar encoder as defined in claim 6; and
  the bit to symbol mapper as defined in claim 6, the bit to symbol mapper being configured to receive the first, second and third modulation symbol bits from the combined PCS and polar encoder and to generate modulation symbols; and
  a modulator configured to receive the modulation symbols from the bit to symbol mapper and to modulate a carrier using the modulation symbols.

14. The transmitter of claim 13, wherein the bit to symbol mapper is further configured to combine two sets of modulation symbol bits received from the combined PCS and polar encoder to form a 64 quadrature amplitude modulation symbol.

* * * * *